United States Patent
Shafer et al.

(10) Patent No.: US 8,823,357 B2
(45) Date of Patent: Sep. 2, 2014

(54) RADIO FREQUENCY POWER AMPLIFIER PROTECTION SYSTEM

(75) Inventors: Thomas Ogle Shafer, Seattle, WA (US); Tony Monroe Bragg, Everett, WA (US); Gary Altman, Kirkland, WA (US)

(73) Assignee: Spectralux Corporation, Redmond, WA (US)

( * ) Notice: Subject to any disclaimer, the term of this patent is extended or adjusted under 35 U.S.C. 154(b) by 457 days.

(21) Appl. No.: 13/216,876

(22) Filed: Aug. 24, 2011

(65) Prior Publication Data

US 2013/0049735 A1 Feb. 28, 2013

(51) Int. Cl.
*G01R 19/00* (2006.01)
(52) U.S. Cl.
USPC .................................. 324/76.11; 330/10
(58) Field of Classification Search
USPC ......... 324/76.11, 600, 602, 609; 330/298, 10; 455/277.1
See application file for complete search history.

(56) References Cited

U.S. PATENT DOCUMENTS

| 7,486,144 B2 | 2/2009 | Mitzlaff et al. |
| 2004/0087295 A1* | 5/2004 | Abbasi et al. ............... 455/277.1 |
| 2008/0218271 A1* | 9/2008 | Mitzlaff et al. ............... 330/298 |

* cited by examiner

*Primary Examiner* — Vincent Q Nguyen
(74) *Attorney, Agent, or Firm* — Davis Wright Tremaine LLP; George C. Rondeau, Jr.

(57) ABSTRACT

A radio frequency (RF) power amplifier protection system for a radio. The protection system utilizes a resistive tap connected to the drain of a power amplifier transistor and a high speed voltage detector. The protection system uses short, low-power tests pulses to determine the quality of an antenna load upon tuning the radio to an RF carrier frequency by transmitting the short test pulse. If the measured voltage value exceeds a calibrated value, the power of the RF transmitter is reduced for subsequent operation or the RF transmitter is shut down completely. The invention also includes a system and method for detecting when an antenna is disconnected from a radio using an low frequency AC signal to measure the resistance of an antenna connected to an RF transmitter.

23 Claims, 6 Drawing Sheets

RADIO FREQUENCY POWER AMPLIFIER PROTECTION SYSTEM

BACKGROUND OF THE INVENTION

1. Field of the Invention

The present invention is directed generally to radio frequency (RF) power amplifiers that are at risk of being damaged as a result of poor load impedances, and more particularly to systems and methods for protecting RF power amplifiers.

2. Description of the Related Art

Power amplifiers are used in RF transmitters to rebroadcast RF signals at high power levels. Because RF transmitters must accurately rebroadcast these signals, the power amplifiers within the transmitters must have high fidelity (e.g., the power amplifiers should maintain linear performance).

In practice, a power amplifier stage may use a variety of silicon die technologies. One example is a field effect transistor (FET) such as a lateral diffused metal-oxide-semiconductor (LDMOS) transistor. The gate of the transistor is typically coupled to an RF input waveform at a given fundamental frequency, which typically comprises an RF carrier modulated with information to be communicated over the air. The transistor then generates an amplified RF signal at its drain (or "output"), which creates a voltage response between the drain and source. The RF voltage response is a function of a drain current generated in the transistor and the transistor's load impedance, which is based on an output matching network. Generally, the RF voltage response comprises a spectral component at a fundamental frequency and spectral components at one or more harmonic frequencies.

In controlled-impedance systems, the load that is connected to a signal source will reflect some of the source power. To get full transfer of power to a "load" (e.g., an antenna) from an RF signal source, the load impedance should be equal to the source impedance, which in practice is normally 50Ω (ohms). If the load impedance is different from the source impedance, a portion of the transmitted power will be reflected back. The figure of merit which establishes the quality of the load is called Voltage Standing Wave Ratio ("VSWR"), which defines how much of the outgoing signal is reflected back. The reflection coefficient ($\Gamma$) of the load is defined by:

$$\Gamma = (Z_L - Z_S)/(Z_L + Z_S)$$

where $Z_L$=load impedance (i.e., the antenna) and $Z_S$=source impedance (i.e., the transmitter). It is noted that $Z_L$ and $Z_S$ are complex values, so the expression for $\Gamma$ is a complex value with a magnitude and phase angle. The value of $\Gamma$ is a ratio of the reflected voltage and forward-going voltage (i.e., $\Gamma = V_{reflected}/V_{forward}$). Negative values imply that a 180-degree phase reversal also occurs. From this equation, it is seen that load impedances greater or less than the source impedance (e.g., 50Ω) will reflect some voltage. The amount of voltage that is reflected can be quantified by determining the VSWR:

$$|\Gamma| = (VSWR-1)/(VSWR+1)$$

Note that because power (P) is equal to voltage (V) squared divided by impedance (Z) (i.e., $P=(V^2)/Z$ or $V=(P*Z)^{0.5}$), the reflection coefficient ($\Gamma$) which defines reflected voltage is the square root of the reflection coefficient that defines reflected power. Therefore, for a perfect load-match ($Z_L$=50Ω), no voltage is reflected, and thus no power is reflected. If the load impedance is infinite (e.g., an open-circuit), 100% of the power and voltage is reflected back.

It is important to also note that in complex modulation schemes, such as Eight-ary Differential Phase-Shift Keying ("D8PSK"), the signal amplitude is varying. Thus there is a peak power and a root mean square (RMS) power. While RMS values are of primary concern regarding power delivery to the load, peak power is important when designing a method to avoid damage caused by reflections. The ratio peak power to RMS power is typically 1.414 in constant envelope modulation systems. This ratio is often referred to as a "crest factor," and may be expressed in decibels. A typical crest factor for D8PSK modulation is approximately 4 dB.

In practice, transmitter antennas are not a perfect load. For example, an acceptable load mismatch for an antenna used in a Controller Pilot Data Link Communications (CPDLC) application is VSWR equal to 2. A VSWR equal to 2 will reflect about 33% of the forward-going voltage. Thus, if a radio is tuned to deliver 15 Watts RMS power into a 50Ω load, which requires a peak voltage of 32.5 volts, then the peak reflected voltage will be 10.7 volts (33% of 32.5 volts). With 100% addition of the forward and reflected voltages, the peak voltage at the load would then be 43.2 volts (32.5+10.7 volts).

As discussed above, the power amplifier used for a high power RF transmitter application is typically a discrete device such as an LDMOS transistor. Such devices are at risk of permanent damage due to excessive reflected voltages. Thus, for damage prevention, the peak voltage at the power amplifier is the most important factor.

RF devices such as CPDLC transmitters are generally cascaded systems of complex impedances. PCB traces, directional couplers, lumped-element filters, impedance-match circuits, a feeder cable, and even the load itself, have finite phase lengths which depend not only on the reactive values of their impedances, but also on the RF carrier frequency. What this implies is that the peak voltage at the load created by the forward and reflected signals will experience a phase-shift between the antenna and the power amplifier, so that while worst-case at the antenna can be 43.2 volts, using the example above, the phase shift can make the cumulative voltage at the transistor be any value between 32.5+/−10.7 volts.

When designing an RF transmitter, the phase of the antenna and feeder cable is an unknown. As a result, the forward and reflected voltages will superimpose and create a "net" delivered power from the transmitter. This is a natural response of traditional open-loop systems that can be seen as a power "sag," or excess power, compared to a desired power. However, in closed-loop systems (e.g., systems using Cartesian feedback), an RF transmitter will attempt to compensate and will force the power back to its set point (e.g., 15 watts). This can cause damaging voltage levels at the power amplifier when, unlike an open-loop condition that would result in a "sag," the feedback loop forces the power back up and creates excessive voltage at the transistor.

DETAILED DESCRIPTION OF THE INVENTION

In a high-power RF transmitter application, a bad load impedance can potentially damage the transmitter power amplifier (PA). The mechanism for this damage may be a reflection of a portion of the transmitted power which produces a voltage at the PA that exceeds the physical limits of the device. The amount of power reflected can be quantified by a quantity referred to as Voltage-Standing-Wave-Ratio (VSWR). In traditional open-loop designs, the reflected voltage will cause a sag in power which automatically compensates for potential excessive voltages and prevents damage. However, closed loop systems (e.g., systems using Cartesian feedback) that attempt to return the power to its design level in response to a sag in voltage, may cause irreversible damage if the system raises the voltage level above the damage threshold of the PA.

In avionics systems installations, the antenna load can present a high enough VSWR to potentially damage a transmitter with power-leveling feedback. The magnitude of the load VSWR and the length of feeder cable are generally unknown. Furthermore, the resulting voltage at the PA transistor depends on the RF carrier frequency. As described below, a method is provided to detect a damaging condition created by the antenna impedance and to compensate either by preventing a transmitter from transmitting altogether, or by lowering the output power to an acceptable, non-damaging level.

One method of detecting a damaging condition is to measure the voltage at the PA transistor drain using a high-impedance resistive tap, and then use a comparator to turn off the PA on the rising edge of the carrier voltage before it exceeds the transistor drain-source breakdown voltage. However, this method is limited to fairly low carrier frequencies because of the finite propagation delay of comparators, even though they may be high-speed devices. In a high frequency application, the over-voltage condition will occur before the comparator is able to shut off the power amplifier. Thus, this method will not work for applications such as avionics applications that use relatively high RF carrier frequencies (e.g., 118 MHz to 137 MHz, or the like).

Embodiments of the present invention use a resistive tap connected to the drain of a PA transistor, and a high speed voltage detector that follows the baseband waveform that is modulating the RF carrier signal. The peak excursions of the voltage detector output are followed and sampled using a moderate-speed digital-analog converter (DAC). During manufacturing, a radio may be calibrated with a low-power test pulse while transmitting into a known good 50Ω load by measuring the peak output voltage from the voltage detector over the operating RF band. Then, when the radio is used in an operational mode, it "tests" the quality of the antenna impedance each time it is tuned to a new carrier frequency for the first time by transmitting the short, low-power test pulse. If the measured voltage from the detector exceeds the calibrated value, the output power of the transmitter is backed off (e.g., backed off by 3 dB) or shut down completely depending on the ratio of the test voltage to the calibrated value.

Figure 1:
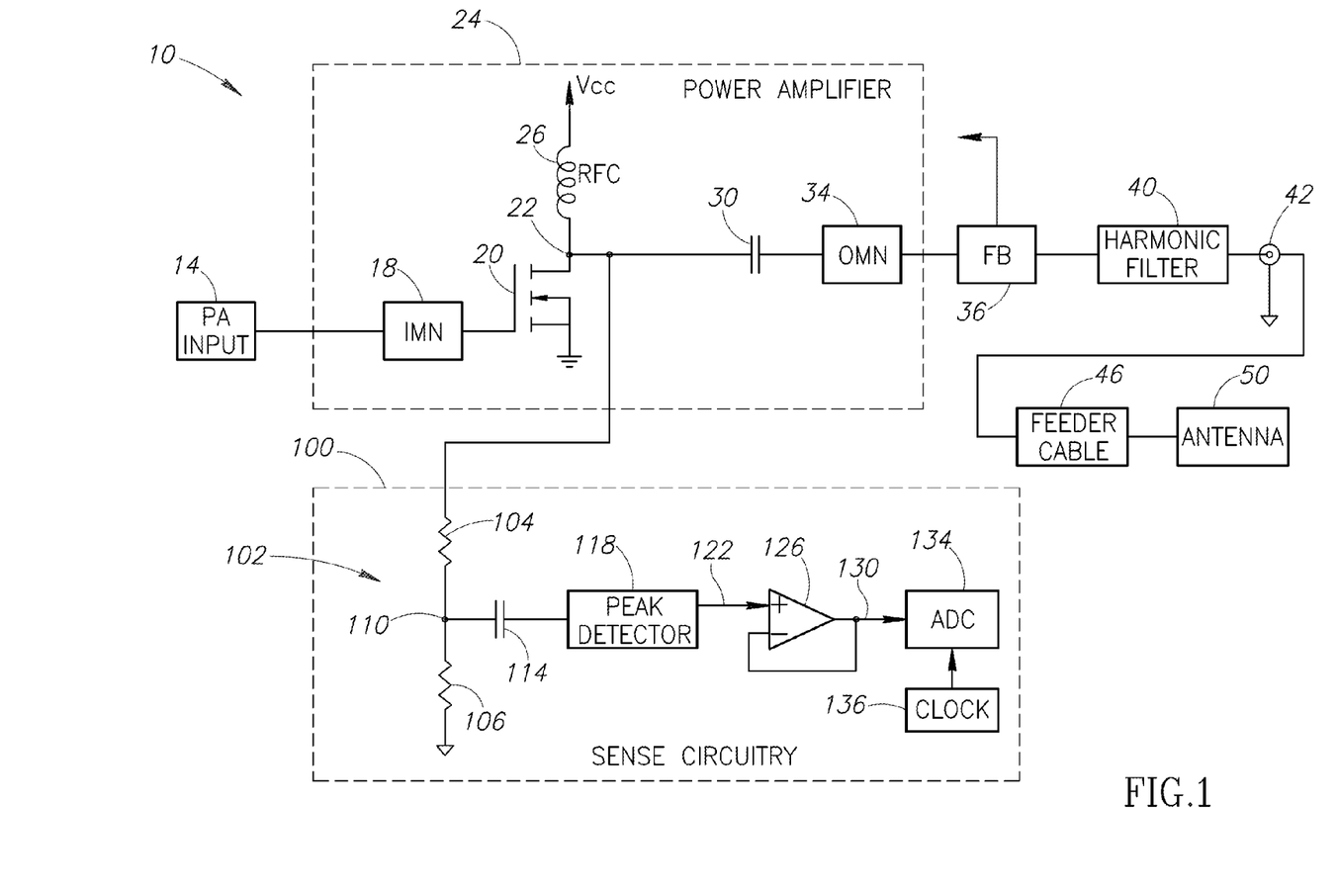
FIG. 1 is a block diagram of an RF transmitter protection system in accordance with an embodiment of the present invention.

FIG. 1 illustrates a block diagram of an RF transmitter 10 for a radio that, for example, may be used in an avionics application. The transmitter 10 includes a power amplifier 24 comprising a LDMOS transistor 20. The transmitter 10 also includes sense circuitry 100 configured to protect the transistor 20 from damage that would otherwise be caused by excessive voltage on the drain of the transistor. In addition to the LDMOS transistor 20, the power amplifier 24 includes an input impedance matching network (IMN) 18, an output impedance-matching network (OMN) 34, drain DC biasing via an RF choke (RFC) 26, and a DC blocking capacitor 30. Although not shown for simplification purposes, the power amplifier 24 may also include gate DC biasing, stability feedback, and the like. The transistor 20 may receive RF signals from a power amplifier input source 14 (e.g., a modulator or driver amplifier). The input source 14 may also be used to generate the test signals described herein. The output of the power amplifier 24 may be coupled to an antenna port 42 through a feedback coupler 36 (e.g. a directional coupler) and a harmonic filter 40. The antenna port 42 may in turn be coupled to an antenna 50 via a feeder cable 46.

If the net voltage (DC+AC voltages) at the drain of the transistor 20 (i.e., electrical node 22) exceeds the drain-to-source breakdown voltage (BVdss) of the transistor, the transistor will be damaged. Because of the phase length between the antenna 50 and the drain of the transistor 20, the drain AC voltage can actually be larger than the voltage at the antenna. The drain AC voltage can also be smaller depending on the phase length. This phase length is determined not only by the net reactive impedance, but also the length of the feeder cable and the RF carrier frequency.

The sense circuitry 100 comprises a high-impedance voltage divider 102 attached to the drain of the transistor 20 at node 22. As shown, the voltage divider 102 comprises a resistor 104 in series with a resistor 106 between the node 22 and ground. As an example, the resistor 104 may be a 2 kΩ (kilo-ohms) resistor and the resistor 106 may be a 120Ω resistor. Because of its relatively high impedance, the voltage divider 102 has negligible effect on the drain-source resistance of the transistor, which is usually only about 6Ω.

The voltage divider 102 scales down the drain voltage at node 22 approximately 17:1 to match an input dynamic range of an RF peak detector 118 that is coupled to the output 110 of the voltage divider 102 through a capacitor 114. In some embodiments, the capacitor 114 may have a value of 330 pF. As an example, a suitable device for the peak detector 118 is the LTC5507 RF peak detector, available from Linear Technology, Milpitas, Calif. The peak detector 118 is fast enough to capture the cycles of the RF carrier frequency. Perhaps more importantly, the peak detector 118 is operative to easily follow the time-varying envelope of the baseband amplitude modulation that is impressed on the RF carrier signal. The peak detector 118 provides an output DC voltage at electrical node 122 which is roughly linearly-proportional to the voltage of the baseband envelope (see FIG. 2). This output is then buffered by a unity-gain buffer 126 (or "voltage follower"), the output 130 of which is fed into an analog to digital converter (ADC) 134. The ADC may then output digital values corresponding to the peak voltage over time that may be used by software methods described below to detect high VSWR conditions. The sampling speed of the ADC 134 is controlled by a clock 136, which is operative to give the ADC a sampling speed that is sufficiently fast to sample the baseband envelope many times during peak excursions of the amplitude modulated signal.

As discussed above, a comparator that is intended to follow and trigger on the rising edge of the RF carrier voltage at the drain of the transistor 20 before that voltage exceeds BVdss is not physically realizable for the VHF band because of the speed required. Furthermore, the primary concern is not whether the load of the antenna 50 at the end of the feeder cable 46 constitutes a high VSWR (i.e., will reflect a larger percentage of the forward-going voltage), but rather, whether the antenna load plus the phase of the circuitry in-between (e.g., the feeder cable 46, etc.), results in a damaging voltage at the drain of the transistor 20.

For a fixed RF carrier frequency, fixed length of feeder cable 46, and an established transmitter transmit power, the effect of a bad VSWR can be observed just as effectively via the output of the peak detector 118 as it can by following the RF carrier voltage directly. The peak detector 118, however, cannot be used to shut down the transmit signal (or the power amplifier 24) before damage occurs because, as discussed above, the speed required is not currently feasible. Therefore, the output of the peak detector 118 is compared against a known calibrated value to determine if the transistor 20 will be damaged. This comparison is done at a relatively low transmitted power where the excess peak excursions will not damage the transistor 20 even with a high VSWR.

Figure 2:
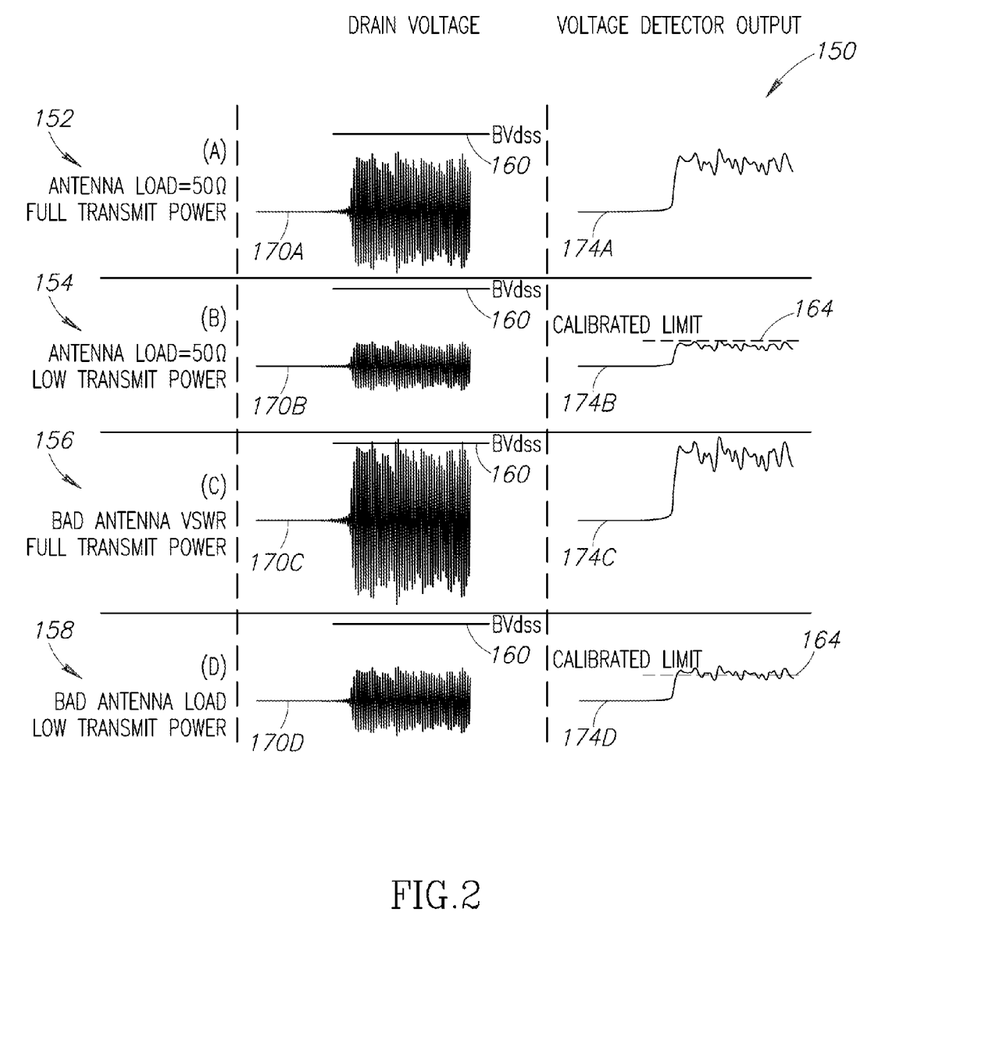
FIG. 2 illustrates voltage waveforms of the RF transmitter protection system of FIG. 1 during various operating conditions.

FIG. 2 is a diagram that illustrates voltage waveforms at the drain of the transistor 20 (waveforms 170A-D) and at the output 122 of the voltage peak detector 118 (waveforms 174A-D). In a first row 152, the transmitter 10 is operating at full power into a known 50Ω load. In this case, very little voltage is reflected, so the waveform 170A does not exceed the BVdss limit 160 of the transistor 20. The corresponding waveform 174A shows the output of the peak detector 118 for this condition.

In a second row 154, the same 50Ω load is connected, but the transmitter 10 is operating at a lower "test" power (e.g., using the input source 14). This results in a smaller AC envelope waveform 170B, and a correspondingly smaller waveform 174B at the output 122 of the peak detector 118. The peak of the waveform 174B can be used to establish a calibration level or limit 164 for the known 50Ω load. Against this level 164, all unknown loads, at the same VHF frequency and with no change in the feeder cable 46, can be tested.

If the output 122 of the peak detector 118 exceeds this limit 164 at low power, then the transistor 20 would be damaged at full power. This condition is illustrated in a third row 156, which shows waveforms when the transmitter is transmitting at full power with an antenna having a high VSWR. As shown, the peak AC voltage of the waveform 170C exceeds the BVdss limit 160. This would damage the transistor 20 of the power amplifier 24.

As shown in a fourth row 158, however, at the test power, the transistor drain AC voltage waveform 170D is still well-below the BVdss limit 160, but the peak detector output waveform 174D exceeds the calibration limit 164. Thus, using a low power test signal (e.g., waveforms 170B and 170D), an antenna having a high VSWR can be detected without risking damage to the transistor 20. If the detector output waveform 174D exceeds the calibration limit 164, the transmitter 10 could be disabled, or the output power of the transmitter 10 could be reduced to protect the transistor 20 of the power amplifier 24.

As discussed above, embodiments of the present invention utilize a low power "test pulse" to detect a potentially damaging VSWR and to determine the quality of the load at the antenna 50. In some embodiments, this test pulse is of a short duration and has a lower power than the rated power. In general, the test pulse needs to be just long enough to ensure that the value measured by the ADC 134 (see FIG. 1) is a scaled representation of the actual value of the drain voltage at node 22. Since there is a finite ramp-up time of the test pulse, and a finite propagation delay from the input of the peak detector 118 to the time point when the ADC 134 measures the voltage from the peak detector, it is desirable to provide a test pulse of sufficient duration so that the output of the peak detector reaches a substantially steady condition, which allows multiple ADC samples from which the peak value can be filtered.

The output power of the test pulse should be low enough that excessive voltage at the drain of the transistor 20 caused by a poor antenna load cannot damage the transistor during the test pulse. Since it is known that a good antenna load is characterized by negligible reflections, the measured voltage value of an unknown load during the test pulse can be compared to the value measured with a known good antenna (i.e., a calibrated value). If the measured value exceeds the calibrated value, then a load VSWR and phase condition exist that can damage the transistor 20 if the transmitter 10 was to transmit signals at rated power. The output power of the transmitter 10 may then be backed off from rated power for subsequent normal operations based on the amount that the measured voltage value exceeds the calibrated value so that the transmitter 10 can be used without causing damage to the transistor 20.

As discussed above, the magnitude of the AC voltage at the drain of the transistor 20 depends not only on the magnitude and phase of the antenna load 50, but also on the length of feeder cable 46 and the operating RF carrier frequency in the VHF band. In any installation, the length of the feeder cable 46 is an unknown which must be factored-out of a calibration test. Transmitting into a perfect 50Ω load, with uniform loss between the output of the power amplifier 24 and the load, where the transmitted power is exactly the same across the entire VHF band, it would be expected that the peak voltage of the test pulse to be the same at every frequency. However, the loss of the harmonic filter 40 (see FIG. 1) varies across the frequencies of the VHF band. Additionally, the power output of the transmitter 10 is not uniform, and the phase length of the feeder cable 46 is not equal across the frequencies of the VHF band. Therefore the calibration test pulse voltage, measured at the output 122 of the peak detector 118, will also not be uniform across the frequencies of the VHF band.

In order to adequately measure the unknown antenna VSWR, the low-power calibration test pulses should be performed for several frequencies across the operational band, and for several phase lengths from 0 to 180 degrees between the antenna connector and the 50Ω load. The measured response to varying phase lengths may be averaged to yield a single calibration value at each calibration frequency.

Figure 3:
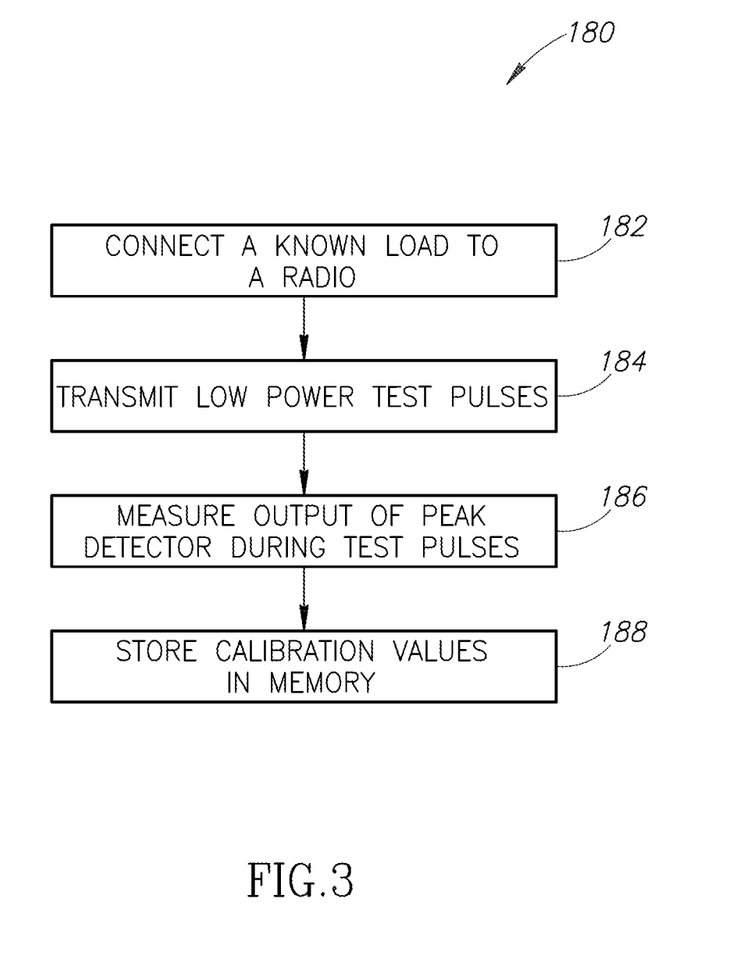
FIG. 3 illustrates a calibration process for use with an RF transmitter protection system.
Figure 4:
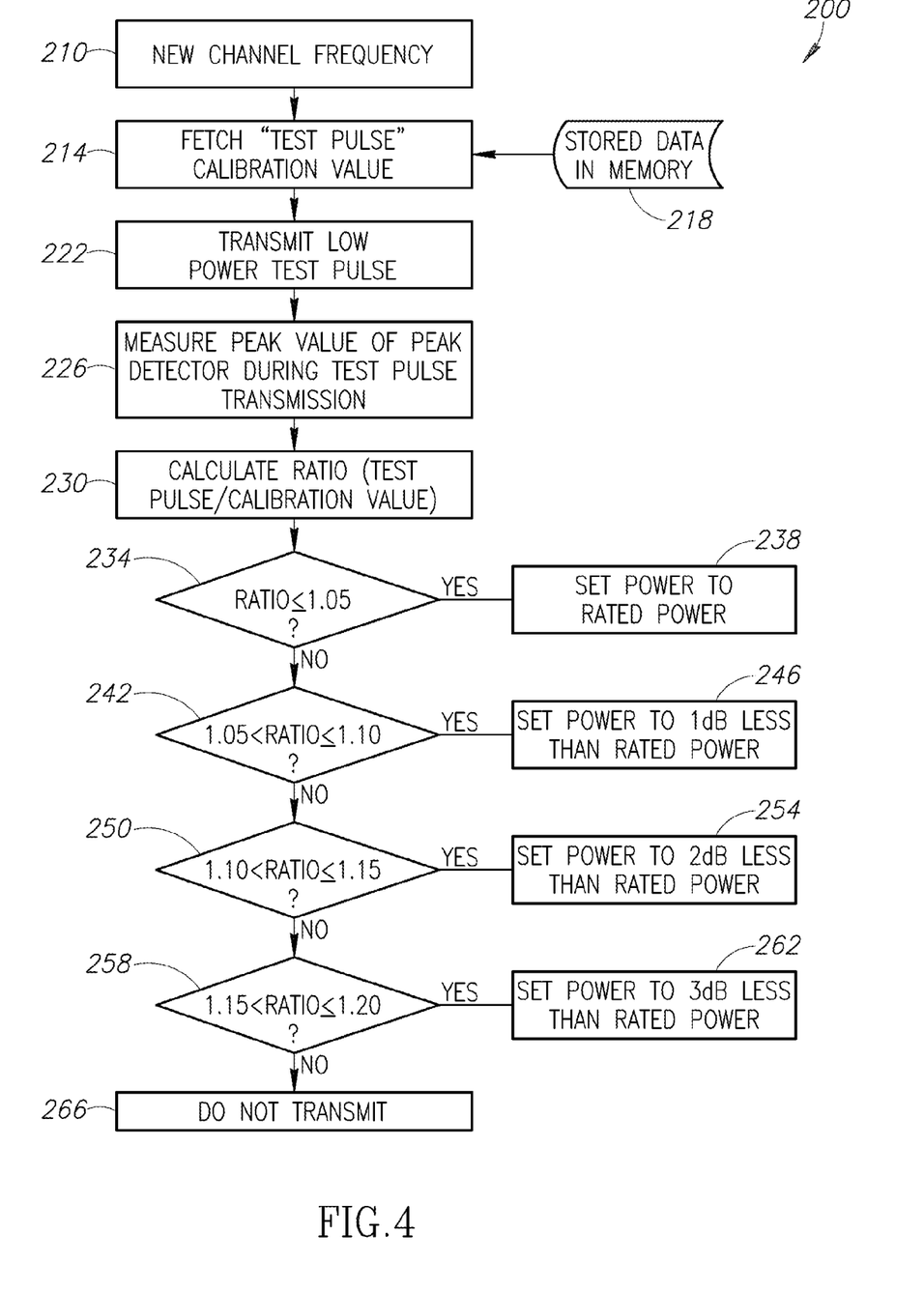
FIG. 4 illustrates a process for implementing an RF transmitter protection system.

FIGS. 3 and 4 show processes 180 and 200, respectively, that may be used for determining the quality of an antenna load and responding appropriately to prevent damage to the power amplifier transistor 20 of a transmitter (e.g., the transistor 20 of FIG. 1). The processes 180 and 200 may be performed in software executing on a processor associated with a radio.

The process 180 shown in FIG. 3 illustrates example steps for performing a calibration process. As an example, the calibration process 180 may comprise connecting a known 50Ω load (block 182), and measuring the output of the peak detector 118 for a plurality of test pulses transmitted at a lower power, blocks 184 and 186. Measurements may be taken for phase lengths between 0 and 180 degrees (using suitable steps, e.g., 10 degrees, or the like). For each phase length, measurements may be taken using test pulses at a plurality of frequencies (e.g., 1 MHz steps throughout the operational VHF band). The resulting calibration values, which are the test pulse voltages measured by the ADC 134 while transmitting into a known 50Ω load, are stored in memory (e.g., an EEPROM), block 188. As can be appreciated, the calibration process 180 may be performed once during manufacturing or installation of a radio, or may be performed at other desirable times.

The process 200 shown in FIG. 4 is performed after the calibration process 180 and may be used during normal operation of a transmitter. In block 210, the transmitter is programmed or "tuned" by a user to transmit at a new VHF channel. Before transmitting a standard message on the new VHF channel, the process 200 firsts tests the antenna load to ensure that the transistor of the power amplifier will not be damaged. In steps 214 and 218, the process fetches the test pulse calibration value for the new channel frequency from memory. In blocks 222 and 226, the low power test pulse is transmitted and the voltage at its peak is measured at the ADC 134 (see FIG. 1) as described above. In block 230, the measured value is compared to the calibrated value to determine a test ratio, which is the measured value divided by the calibrated value retrieved from memory. A high value for the test ratio indicates a poor antenna load, which will cause the voltage at the drain of the power transistor to be elevated.

In decision blocks 234, 242, 250, and 258, the output power of the transmitter is backed off appropriately according to the comparison of the measured value of the test pulse to the calibrated value as determined by the test ratio. Specifically, if the test ratio is less than or equal to 1.05 (block 234=yes), the transmitter is set to deliver full rated power, block 238. It is noted that in this embodiment, the transmitter is permitted to transmit at full power when the measured ratio is slightly larger than the calibration value (e.g., test ratio greater than 1.00 but less than 1.05). This 5% overage tolerance is provided to reduce the likelihood of "false alarms" in detecting a bad load due to minor measurement errors or variances.

If the test ratio is greater than 1.05 but less than or equal to 1.10 (block 242=yes), the transmitter is set to deliver 1 dB less than rated power, block 246. In this regard, when the transmitter is transmitting at a lower power, the voltage at the drain of the transistor 20 is less likely to exceed BVdss. If the test ratio is greater than 1.10 but less than or equal to 1.15 (block 250=yes), the transmitter is set to deliver 2 dB less than rated power, block 254. If the test ratio is greater than 1.15 but less than or equal to 1.20 (block 262=yes), the transmitter is set to deliver 3 dB less than rated power, block 254. Further, if the test ratio is greater than 1.20, the transmitter is disabled, block 266. It will be appreciated that the specific criteria and power reduction levels used in the example of FIG. 4 may be varied as desired. For example, in some embodiments the transmitter power is reduced in steps smaller than 1 dB. In other embodiments, the transmitter is simply disabled if the test ratio is above a predetermined threshold.

Another embodiment of the present invention provides a system and method for detecting when an antenna is disconnected from a radio. This can occur either by way of improper installation, damage to the antenna, or the like. The ability to detect when an antenna is disconnected may be especially important for high-power transmitters where a disconnected antenna will reflect 100% of the transmit signal and may damage the power amplifier stage (e.g., the transistor 20 of FIG. 1 described above). Methods such as performing a DC measurement through the radio's antenna connector may not be feasible since a DC voltage on an antenna connector can damage test equipment. Further, using forward and reflected power measurements at the radio's tuned VHF band may not be practical either because the varying phase length of the system can change the actual value of the antenna's impedance. Thus, the present invention provides an antenna-disconnect measurement system that uses an ultra-low frequency AC signal to measure the resistance of an antenna connected to a transmitter. The system is described below with reference to FIGS. 5 and 6.

Figure 5:
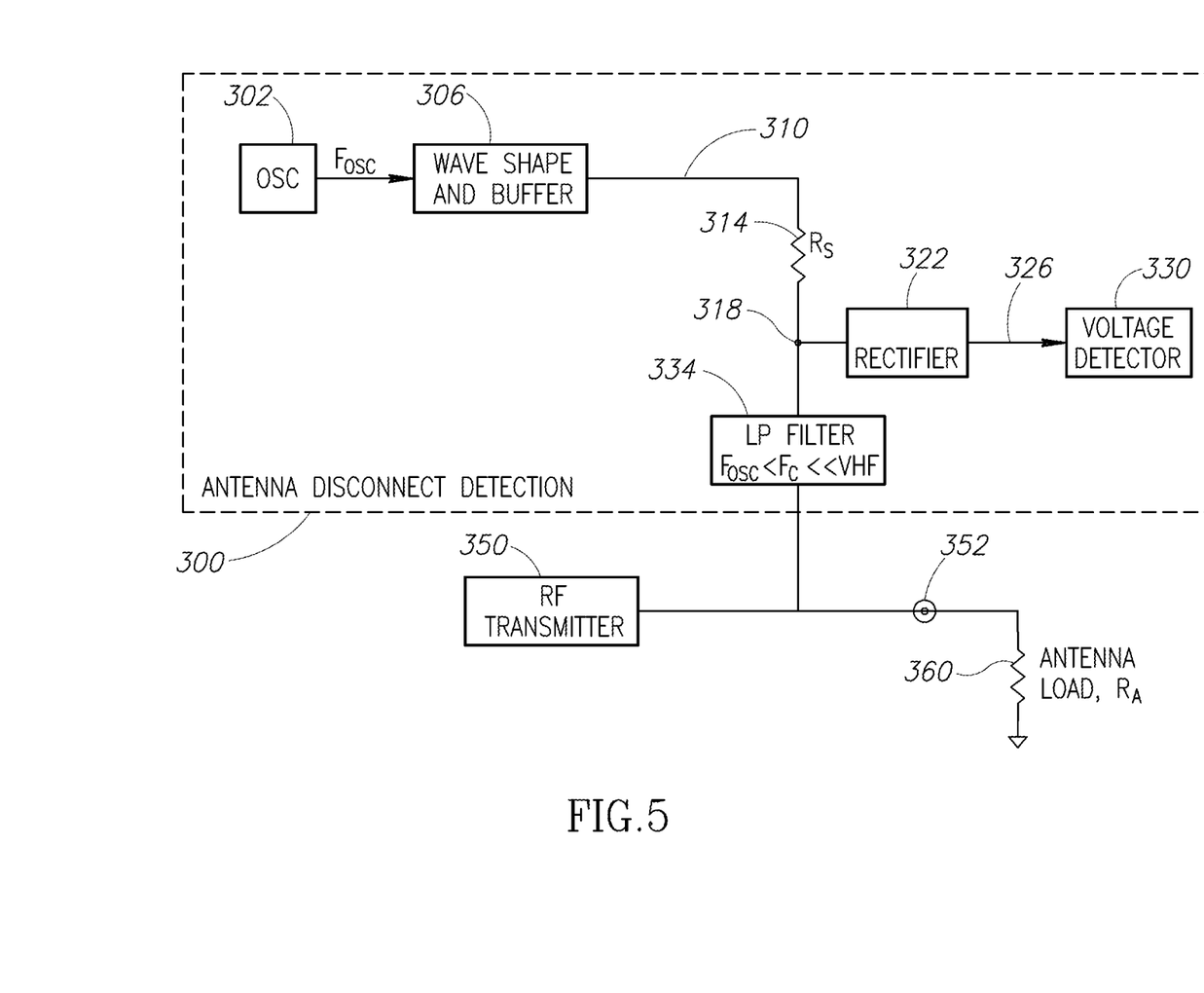
FIG. 5 is a block diagram of an antenna disconnect detection system for an RF transmitter.

FIG. 5 illustrates a simplified block diagram of an antenna disconnect detection system 300. The system 300 is coupled to an antenna port 352 of an RF transmitter 350. The antenna port 352 is connected to an antenna load 360 (or simply "antenna"). The RF transmitter 350 may be similar in several aspects to the transmitter 10 shown in FIG. 1 and described above. In general, the antenna disconnect system 300 is a voltage divider circuit that utilizes an oscillator 302 to provide an AC signal across a source resistance (Rs) 314 connected in series with an antenna load 360.

The oscillator 302 in one embodiment is a 32 kHz crystal oscillator. The oscillator 302 may be small, relatively inexpensive, and can be turned on and off with an external digital control. The output of the oscillator 302 however, is typically a square or clipped sine wave that may be full of harmonic products. Unfiltered, these harmonic products could extend into maritime, aeronautical, and broadcast bands or higher, possibly violating emissions limits. Furthermore, the peak-to-peak voltage swing of the output of the oscillator 302 may depend heavily on the load presented to its output, as well as its bias voltage. As can be appreciated, it is desirable for the oscillator's peak-to-peak voltage to be a consistent, known value and that it be free from harmonic products, so that accurate measurements may be taken. Therefore, a wave-shaper and buffer amplifier 306 may be added to the output of the oscillator 302. The wave shaper 306 transforms the output of the oscillator 302 into a pseudo-sine wave that will have negligible harmonics. Moreover, the buffer 306 is chosen to drive a large load so that it will not be loaded down by varying impedances of the antenna 360.

The source resistance 314 is one half of the voltage divider. The antenna load 360 is the other half. Thus, the voltage at the output 310 of the wave-shaper and buffer amplifier 306 is divided between the resistance 314 and the antenna load 360 at a voltage divider output node 318.

A low pass filter 334 is also provided that has a high enough cutoff frequency (Fc) to pass the AC signal from the oscillator 302, which as a frequency $F_{OSC}$ (e.g., 32 kHz). The cutoff frequency (Fc) should be low enough so that it can attenuate the VHF band (e.g., 118 MHz to 137 MHz) transmissions from the radio transmitter 350. Otherwise, if transmissions from the RF transmitter were not blocked by the low pass filter 334, false alarms would occur. The low-pass filter 334 cutoff frequency (Fc) and Q factor should also be designed so that presence of the antenna-disconnect-detection circuitry 300 does not change the load-line impedance of the power amplifier of the RF transmitter 350.

A rectifier 322 is connected to the voltage divider output node 318 between the source resistance 314 and the low-pass filter 334. The rectifier 322 is operative to provide a DC voltage that is proportional to the low frequency (e.g., 32 kHz) AC voltage across the antenna load 360. In some embodiments, a full-wave rectifier (as opposed to a half-wave rectifier) is used, which provides better accuracy since its output is not dependent on the duty cycle of the oscillator 302.

The output 326 of the rectifier 322 may then be input into a voltage detector 330 (e.g., an ADC), where it can be digitized and compared against thresholds in software, or connected to hardware comparators in order to flag a shorted antenna (e.g., the resistance of the antenna load 360 is near zero) or an open-circuited or disconnected antenna (e.g., the resistance of the antenna load 360 is extremely large).

Figure 6:
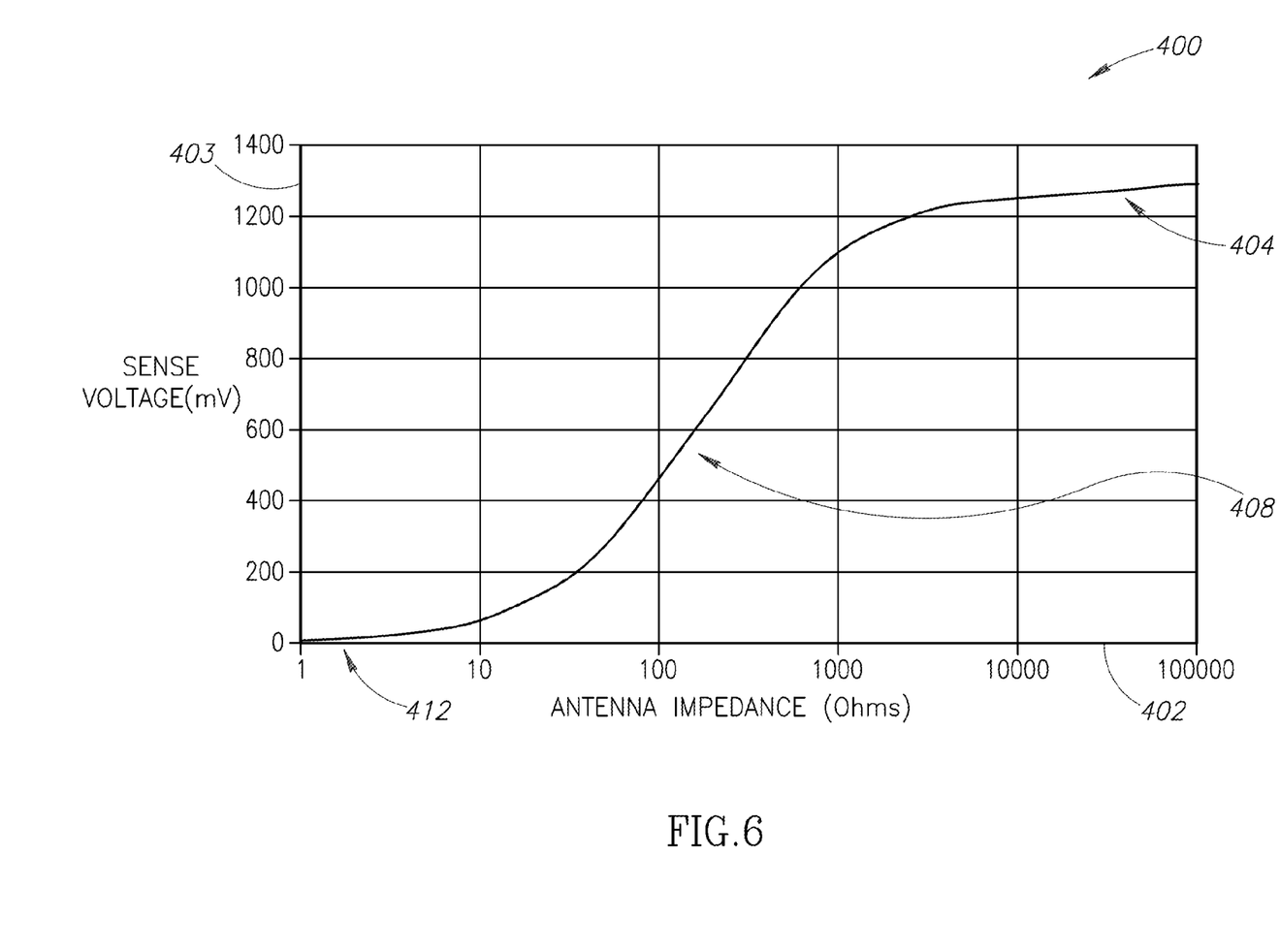
FIG. 6 is a graph illustrating the relationship between a sensed voltage of the antenna disconnect detection system and the impedance of an antenna of an RF radio.

FIG. 6 is a graph 400 that illustrates an example of the relationship between the voltage appearing at the output 326 of the rectifier 322 (vertical axis 403) and the impedance of the antenna load 360 (horizontal axis 402). As shown, when the resistance of the antenna load 360 is very small, which would indicate a short circuit condition, the voltage appearing at the output 326 of the rectifier 322 is very small (see arrow 412). Conversely, when the resistance of the antenna load 360 is very large, indicating an open circuit or disconnected antenna condition, the voltage is very large (see arrow 404). When the antenna load 360 is properly connected, the voltage at the output 326 of the rectifier 322 will be between these two extremes (see arrow 408). Therefore, by comparing the measured voltage at the output 326 of the rectifier 322 to expected values or ranges of values, the antenna-disconnect system 300 may be used to detect when an antenna has been disconnected.

In some embodiments, the antenna disconnect detection system 300 may be performed in "pulsed" application, wherein the low frequency oscillator 302 is turned on only long enough for the voltage measurement to settle and for measurements to take place. This keeps emissions to a minimum when taking into account that there is also filtering to removed harmonics.

Using software to turn the antenna-disconnect system 300 on and off as desired, the measurement may also be judiciously performed taking into account interoperability and protocol requirements. For example, if the radio's receiver has just received a good message with sufficient signal strength (as indicated by the radio receiver's automatic gain control (AGC) response), there may be a logical decision in the radio's software to not perform an antenna-disconnect test, since no signal would have been received if the antenna were disconnected. As another example, the antenna-disconnect measurement may not be performed after an aircraft has taken off, since the likelihood of an antenna being damaged in flight may be very unlikely. It will be appreciated that other logical decisions may be used to control the operation of the antenna disconnect detection system 300.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A radio frequency (RF) transmitter protection system, comprising:
   an RF signal generator operative to provide a test signal to a power amplifier of the RF transmitter that causes the RF transmitter to operate at an output power that is lower than a rated power of the RF transmitter; and
   a detection system having an input electrically connected to the drain of a power transistor of the power amplifier, the detection system being operative to detect the voltage level at the drain of the power transistor when the power amplifier is transmitting the test signal, the detection system being further operative to compare the detected voltage level to a predetermined value to determine a characteristic of an antenna load connected to the RF transmitter and scale the output power of the RF transmitter during subsequent operation in accordance with the comparison.

2. The RF transmitter protection system of claim 1, wherein scaling the output power of the RF transmitter during the subsequent operation further includes reducing the output power of the RF transmitter based on the comparison between the detected voltage level and the predetermined value.

3. The RF transmitter protection system of claim 1, wherein the detection system is operative to disable the RF transmitter when the detected voltage level is greater than the predetermined value.

4. The RF transmitter protection system of claim 1, wherein the detection system comprises a voltage divider circuit.

5. The RF transmitter protection system of claim 1, wherein the predetermined value is one of a plurality of predetermined values, each of which correspond to an operational frequency of the RF transmitter, and wherein the predetermined value is dependent on the frequency of the test signal.

6. The RF transmitter protection system of claim 1, wherein the RF signal generator and the detection system are configured to operate upon tuning the RF transmitter to a carrier frequency.

7. The RF transmitter protection system of claim 1, wherein the detection system comprises a voltage divider having an output, a peak detector having an input and an output, the input of the peak detector being electrically coupled to the output of the voltage divider, and an analog-to-digital converter electrically coupled to the output of the peak detector.

8. The RF transmitter protection system of claim 1, wherein the characteristic is the impedance of the antenna load.

9. The RF transmitter protection system of claim 1 wherein:
the RF transmitter protection system further comprises memory configured to store the predetermined value; and
the detection system is operative to access the predetermined value in the memory to compare the detected voltage level to the predetermined value.

10. The method of claim 1, further comprising:
storing the predetermined value in memory; and
accessing the predetermined value in the memory to compare the detected voltage level to the predetermined value.

11. A method for protecting a power transistor of a radio frequency (RF) transmitter, the method comprising:
transmitting a RF test signal using the RF transmitter, wherein the RF test signal has an output power that is lower than a rated output power of the RF transmitter;
detecting the voltage level at the drain of the power transistor while the RF test signal is transmitted;
comparing the detected voltage level to a predetermined value to determine a characteristic of an antenna load connected to the RF transmitter; and
adjusting the output power of the RF transmitter during subsequent operation based on the comparison.

12. The method of claim 11, wherein adjusting the output power of the RF transmitter further includes reducing the output power of the RF transmitter.

13. The method of claim 11, further comprising disabling the transmitter dependent upon the result of comparing the detected voltage level to the predetermined value.

14. The method of claim 11, wherein the predetermined value is one of a plurality of predetermined values, each of which correspond to an operational frequency of the RF transmitter, and wherein the predetermined value is dependent on the frequency of the test signal.

15. The method of claim 11, wherein the RF test signal is transmitted upon tuning the RF transmitter to a new carrier frequency.

16. The method of claim 11, wherein detecting the voltage level comprises detecting peaks of a signal representative of the voltage at the drain of the power transistor, and converting the detected peaks to digital values.

17. The method of claim 11, wherein the characteristic is the impedance of the antenna load.

18. A system for detecting when an antenna is disconnected from a RF radio having a transmitter, comprising:
an alternating current (AC) signal generator operative to generate an AC signal having a frequency that is less than an operational frequency band of the radio;
a resistor electrically coupled between the AC signal generator and an output of the transmitter such that the resistor and the antenna form a voltage divider circuit having an output; and
a detection system operative to measure the voltage level of the AC signal at the output of the voltage divider circuit, and to compare the measured voltage level with a predetermined value indicative of whether the antenna is disconnected.

19. The system of claim 18, further comprising a low pass filter coupled between the resistor and the output of the transmitter, the low pass filter having a cutoff frequency that is greater than the frequency of the AC signal and less than the operational frequency band of the radio.

20. The system of claim 18, wherein the detection system comprises a rectifier electrically coupled to the output of the voltage divider, and an analog-to-digital converter electrically coupled to the rectifier.

21. A method for detecting when an antenna is disconnected from an RF radio having a transmitter, the method comprising:
generating an alternating current (AC) signal having a frequency that is less than an operational frequency band of the radio;
coupling the AC signal to an output of the transmitter through a resistor such that the resistor and the antenna form a voltage divider circuit having an output;
measuring the voltage level of the AC signal at the output of the voltage divider circuit; and
comparing the measured voltage level to a predetermined value indicative of whether the antenna is disconnected.

22. The method of claim 21, further comprising filtering signals having a frequency within the operational frequency band of the RF radio using a low pass filter positioned between the resistor and the output of the transmitter, the low pass filter having a cutoff frequency that is greater than the frequency of the AC signal and less than the operational frequency band of the RF radio.

23. The method of claim 21, wherein measuring the voltage level comprises rectifying the voltage level at the output of the voltage divider circuit and converting the rectified voltage into a digital value.

* * * * *